United States Patent [19]
Betz

[11] 3,976,844
[45] Aug. 24, 1976

[54] DATA COMMUNICATION SYSTEM FOR TRANSMITTING DATA IN COMPRESSED FORM

[75] Inventor: Bernard K. Betz, Edina, Minn.

[73] Assignee: Honeywell Information Systems, Inc., Waltham, Mass.

[22] Filed: Apr. 4, 1975

[21] Appl. No.: 565,308

[52] U.S. Cl. .................. 179/15.55 R; 340/172.5
[51] Int. Cl.² .................................... G06F 7/20
[58] Field of Search ............ 197/19, 20; 340/172.5; 179/15.55 T, 15.55 R; 178/DIG. 3

[56] References Cited
UNITED STATES PATENTS

| | | | |
|---|---|---|---|
| 3,344,406 | 9/1967 | Vinal | 340/172.5 |
| 3,571,807 | 3/1971 | Candy et al. | 340/172.5 |
| 3,582,900 | 6/1971 | Goldman | 340/172.5 |
| 3,636,520 | 1/1972 | Berteau | 340/172.5 |
| 3,798,610 | 3/1974 | Bliss et al. | 340/172.5 |
| 3,801,737 | 4/1974 | Komurn | 178/DIG. 3 |
| 3,898,378 | 8/1975 | Himoshita et al. | 178/DIG. 3 |
| 3,902,009 | 8/1975 | Peneault | 178/DIG. 3 |

*Primary Examiner*—Kathleen H. Claffy
*Assistant Examiner*—E. Matt Kemeny
*Attorney, Agent, or Firm*—John S. Solakian; Ronald T. Reiling

[57] ABSTRACT

Characters which repeat between successive groups or lines on a page, are, except for an initial transmission, not transmitted, thereby decreasing the time for data transmission. Only the non-repeat characters between the successive groups or lines are transmitted along with a "map" (i.e. a sequence of numbers) indicative of the format of the repeat and non-repeat characters of the present group, or line, so as to enable a receiving station to reassemble the compressed data. A new map need not be sent, thereby further decreasing transmission time, if the transmission using an old map which has been previously transmitted compares favorably with the transmission using the new one.

17 Claims, 8 Drawing Figures

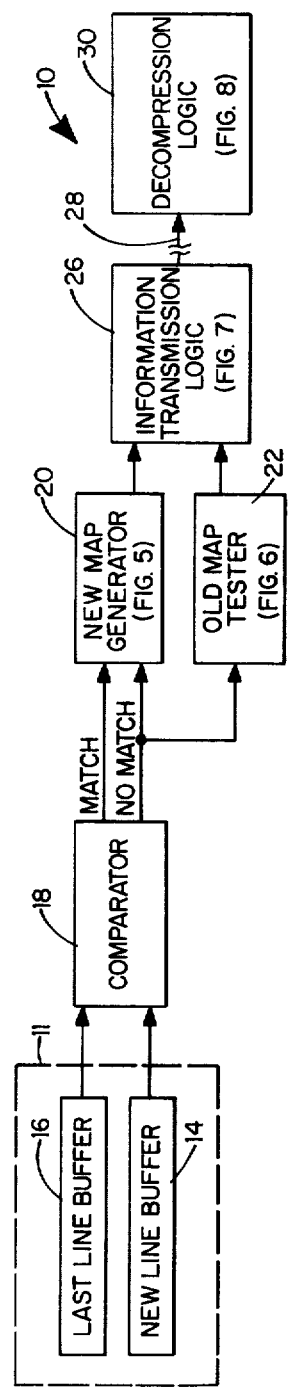
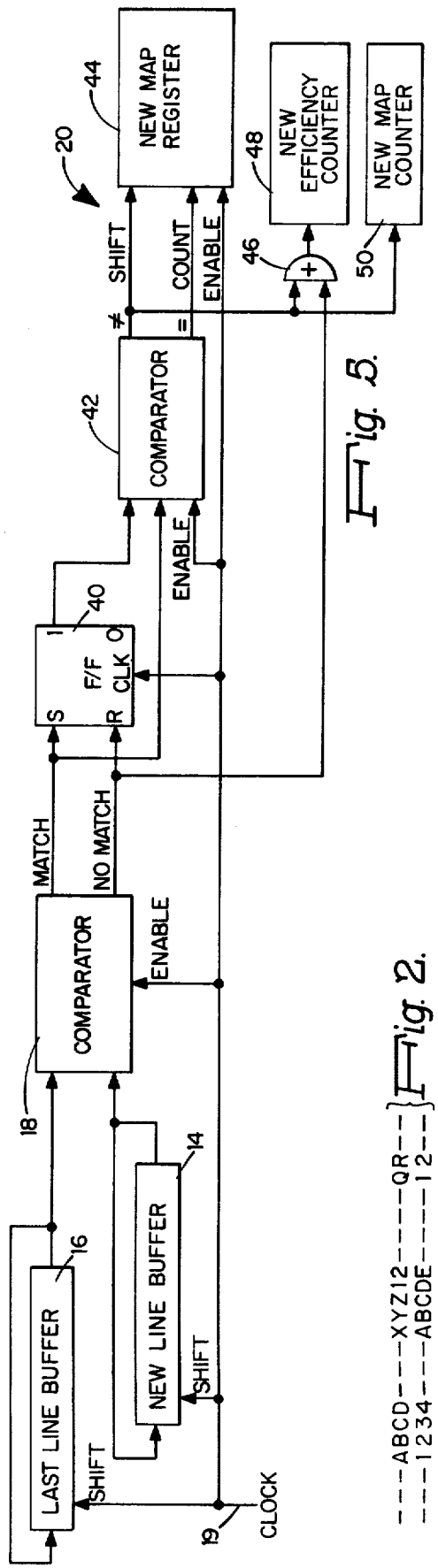

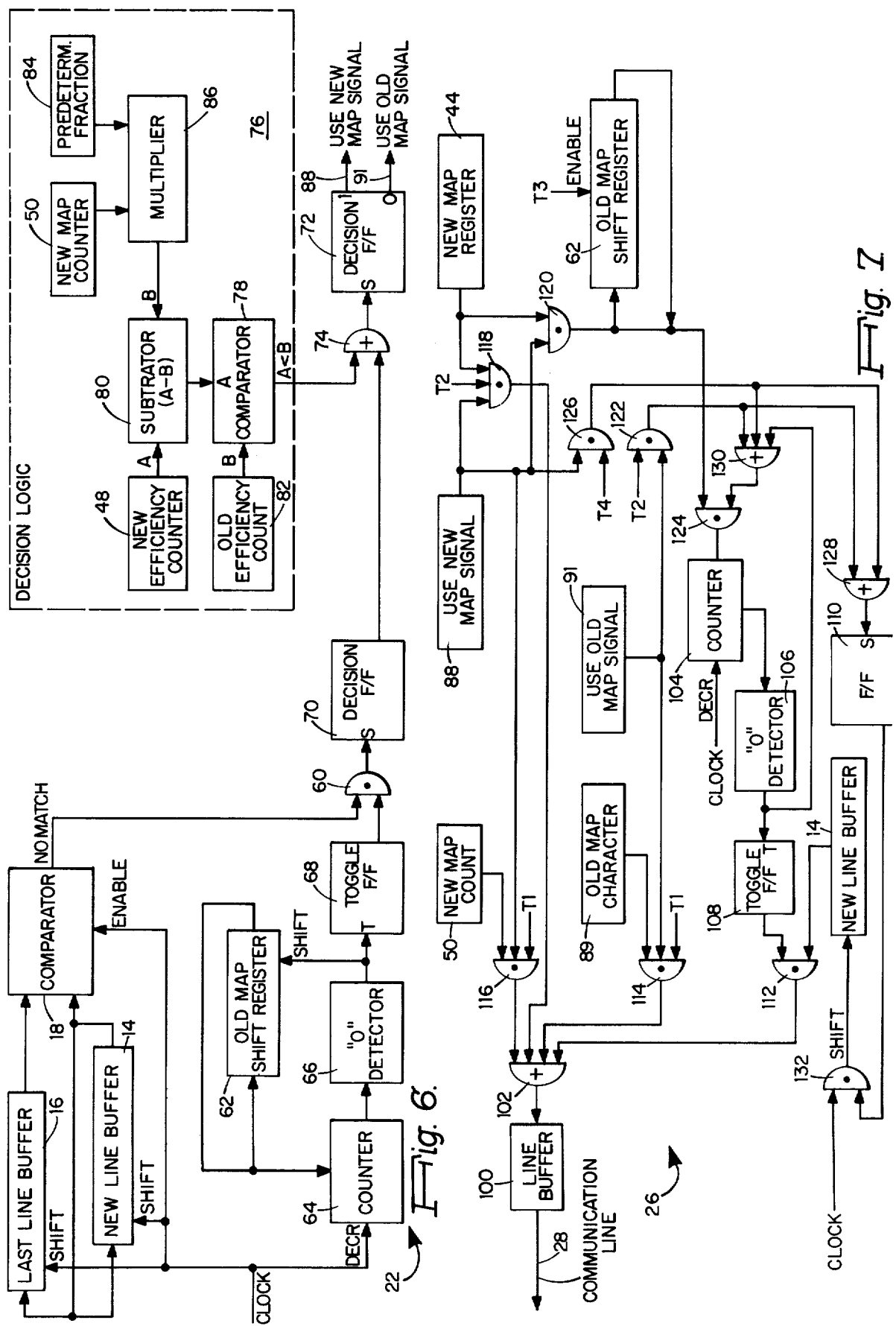

DATA COMMUNICATION SYSTEM FOR TRANSMITTING DATA IN COMPRESSED FORM

BACKGROUND OF THE INVENTION

The present invention relates generally to data communication systems and more particularly to data communication systems in which the data transmitted has certain repetitive characteristics.

In a data communications system which has a requirement of transmitting a great magnitude of data in a minimal period of time utilizing a minimal amount of communication lines, it is often necessary to increase the speed of transmission of such data on the data communication lines at the cost of very complex and expensive equipment. In some systems, it is sometimes found advantageous, in order to reduce transmission time, where the data format allows, to not transmit large blocks of data which have previously been transmitted. For example, if a fixed form is to be transmitted with the variable data included therein, the fixed form need only be transmitted once and the variable data each time as required provided however that proper interlacing apparatus exists at the receiving station in order to recombine the fixed form and the variable data.

It is accordingly a primary object of the present invention to minimize the time required to transmit data which has certain repetitive characteristics.

SUMMARY OF THE INVENTION

The purposes and objects of the present invention are satisfied by providing a data communications system which includes a first buffer and a second buffer, the first buffer coupled to provide a first plurality of data representative of the present data to be compressed and transmitted and the second buffer coupled to provide a second plurality of data representative of the data previously compressed and transmitted. The system further includes means for comparing individual data in the first and second buffers and in response thereto, generating a new map indicating, in the order of comparison, the number of repeat data and the number of non-repeat data detected between the first and second pluralities of data. Further means is included for transmitting only those individual data of the first plurality of data which are detected to be non-repeat data as indicated by the new map.

The system of the present invention may also include an old map which indicates the number of repeat data and the number of non-repeat data detected between two successive, previously compared plurality of data, for determining whether the old map reflects substantially the same numbers of repeat and non-repeat data as does the new map. Also included is further means, included in the means for transmitting, for additionally transmitting the new map if the old map does not reflect substantially the same numbers of repeat and non-repeat data as does the new map. The system may further include in a receiving terminal, means for decompressing the data received in compressed form, wherein the means for decompressing may comprise means for storing the last plurality of data received from the means for transmitting of the transmitting station, means for storing the last map received from the means for transmitting and means for regenerating the data in decompressed form in accordance with the pattern of repeat and non-repeat data indicated by the new map if the new map is used, or in the case where the old map is used, to regenerate such data in accordance with the pattern provided by the old map.

BRIEF DESCRIPTION OF THE DRAWINGS

The advantages of the foregoing description of the present invention will become more apparent upon reading the accompanying detailed description in connection with the figures in which:

FIG. 1 represents a general block diagram of the present invention;

FIG. 2 illustrates two consecutive lines of repeat and non-repeat characters;

FIG. 3 represents a typical map;

FIG. 4 represents the non-repeat characters which are transmitted;

FIG. 5 represents the new map generator of the present invention;

FIG. 6 illustrates the old map tester used in the system of the present invention;

FIG. 7 illustrates the information transmission logic of the system of the present invention.

DETAILED DESCRIPTION OF THE PREFERRED EMBODIMENT

Figure 8:
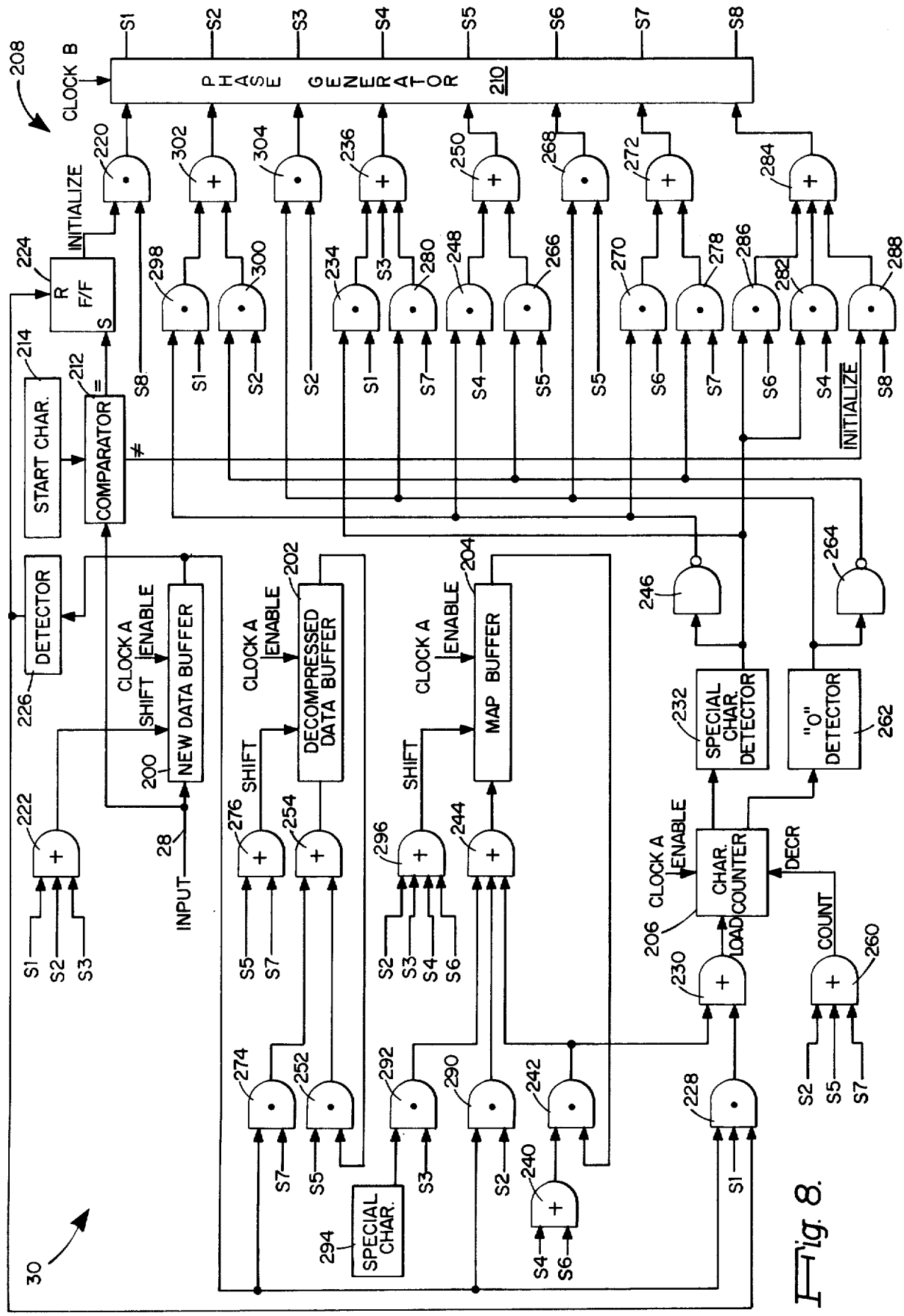
FIG. 8 illustrates the decompression logic of the system of the present invention.

FIG. 1 generally illustrates the system of the present invention. Compression logic 10 includes buffer logic 11, coupled with comparator 18, new map generator 20, old map tester 22, as well as information transmission logic 26. Generator 20, tester 22 and logic 26 are shown in more detail as is decompression logic 30 in the figures as indicated. Decompression logic 30 is located in a receiving terminal coupled with communication line 28. Buffer logic 11 includes last line buffer 16 and new line buffer 14 which are coupled with comparator 18 as shown in FIG. 1 and which are additionally coupled in the manner illustrated in FIGS. 5, 6 and 7.

With last line buffer 16 full with the data of the last line transferred over line 28, and new line buffer 14 full with the new data received for such transfer, each of the characters in buffers 14 and 16, which buffers are shift registers, are compared one by one as shifted out to comparator 18, which determined whether a match or no match condition exists. New map generator 20 utilizes the match and no match signals in generating a new map. During a first phase of operation of the compression logic 10, a new map is generated. During a second phase of the compression logic 10, a determination is made by the old map tester 22 as to whether or not an old map previously generated or the new map presently generated by new map generator 20 is to be used. If the new map is to be used, then it must be transmitted over the communication line 28. As shall be seen, the transmission of the new map causes a relative increase in the number of characters which must be transmitted for the particular line of characters, but a much greater decrease in the number of total characters transmitted for a given page of characters. Since the old map is maintained in the decompression logic 30, it may be quite advantageous to utilize the old map already stored in logic 30, thereby making it unnecessary for the extra characters associated with the old map or new map to be transmitted. The consideration for using the new map, even though this may necessitate the transmission of the extra characters of the new map, and even though the old map is useable, is the expectation that in so using the new map, the further lines to be transmitted would be transmitted in less time than it would have taken using the old map.

Depending upon which is utilized, transmission logic 26 enables the proper format of information to be transmitted over communication line 28. If the old map is to be used, a unique character indicating the use of the old map, is first transmitted followed by the non-repeat characters from the new line buffer 14. If a new map is to be used, the number of characters in the new map (new map count) is transmitted followed by transmission of the characters in the new map itself, which is then followed by the transmission of the non-repeat characters from new line buffer 14. The decompression logic 30 includes means for detecting whether or not the old map or the new map is to be used and in turn utilizes the proper map to receive and decompress the information received over line 28.

Referring to FIG. 2, there are shown two lines of data, typical of the data which the present invention may utilize in increasing the speed of transmission, thereby decreasing the time necessary to transfer data over the communication line. As illustrated by the two lines of data, there are repeat characters shown by way of example by the dashes, and non-repeat characters as indicated. For at least the second line of data, only the non-repeat characters will be transmitted as illustrated in FIG. 4. Thus, the repeat characters or dashes in this case will not be transmitted when line two is transmitted.

FIG. 3 illustrates the map between the two lines of data shown in FIG. 2. The first character (3) indicates the number of repeat characters between the two lines and the second character (4) shows the number of non-repeat characters. This alternates so that the third character of FIG. 3 indicates the number of repeat characters, the fourth character indicates the non-repeat characters, etc. Although the map, as well as the data is illustrated to begin with repeat characters, it should be understood that the present invention may operate with data beginning with non-repeat characters.

The new map generator 20 is shown in FIG. 5. During generation of the new map, the buffers 14 and 16 are configured so as to save the contents thereof. It is noted that the buffers 14 and 16 are shift registers each having a number of character positions, such number compatible with the number of characters in a line of data. Each time a shift pulse is applied, a complete character is shifted to the next position in the buffer. As indicated, the characters in the buffers are shifted character by character each time a clock signal is received. A match or no match condition between the characters of buffers 14 and 16 is indicated at the output of comparator 18 which is also enabled to compare by the clock on line 19. Thus, the comparator 18 when enabled indicates for the present characters being compared, whether there is a match or no match condition. On the next clock cycle, this match or no match indication respectively either sets or resets storage flip-flop 40.

The one output of flip-flop 40 is coupled to one input of comparator 42, whose other input is coupled to receive the match signal from comparator 18. Comparator 42 is also enabled by the clock signal received on line 19. With the indication from the one output of flip-flop 40 coupled to one input of comparator 42, the indication of the comparison of the next two characters shifted from buffers 14 and 16 and compared by means of comparator 18, are compared with the previous indication of the previously compared characters from the buffers 14 and 16. Thus, comparator 42 determines whether or not the characters compared in the previous cycle compare in terms of matching or not matching with the characters presently compared. Thus, if the previous characters matched, then flip-flop 40 would be set and the one output of flip-flop 40 would indicate a binary one signal. If the next two characters from buffers 14 and 16 matched, then this would indicate an equal comparison at the output of comparator 42. Stated differently, an equal comparison is provided at the output of comparator 42 if the previous characters from buffers 14 and 16 generated a no match condition (in which case the one output of flip-flop 40 would indicate a binary zero) and the present two characters compared from buffers 14 and 16 also do not match, in which case the signal on the match output of comparator 18 would also be a binary zero. This equality comparison is coupled to new map register 44 so as to increment or count in the first location thereof, as shall hereinafter be discussed. In the alternative, if there is not an equal comparison between the previously compared characters and the presently compared characters, as indicated by means of comparator 18, flip-flop 40 and comparator 42, then an unequal comparison will result as indicated at the output of comparator 42, thereby causing new map register 44, which is also coupled as a shift register, to shift the count in the first character position of location of register 44 into the next location thereof.

As indicated hereinabove, new map register 44 is thus capable of either shifting data characters from one character position to the next or counting in the first character location or position thereof. Thus, new map register 44 is similar to buffers 14 and 16, and further includes a counter in the first character position thereof. The shifting or counting is enabled by means of the clock on line 19 it being noted that each time there is a shift there is a count or increment by one, but not vice versa. Assuming eight bits per character, each character position in register 44 may comprise for example eight flip-flops. In the first position and in accordance with the counter configuration, these flip-flops would be ganged together such that when a count is enabled as indicated by the equal comparison from comparator 42, the values in such character counter are stored. The next time comparator 42 generates a not-equal condition, a shift is enabled such that the value in the first position character counter is shifted to the next character position in register 44 and the first position is incremented by one. Thus in this manner, the new map as indicated in FIG. 3 is generated. Accordingly, when the initial three repeat characters (as shown in FIG. 3) are received, the counter position in register 44 counts up to three and when a not-equal condition is indicated, the character indicative of the number of repeat characters is shifted to the next character position and the number of non-repeat characters are then counted following which the character indicative of the number of consecutive non-repeat characters is shifted and so on such that the next repeat characters are counted etc. Thus each boundary of repeat and non-repeat characters is detected, and at each such boundary, a shift signal has been provided in order to enable the generation of the new map.

Also coupled to the output of comparator 42 and more particularly the non-equal output thereof, is new efficiency counter 48 and new map counter 50. The other input to new efficiency counter 48 through OR gate 46 is from the no match output of comparator 18. New efficiency counter 48 indicates for each new line, the number of characters to be transmitted if the new map is used, which new map will be generated and stored in new map register 44 as previously discussed. Counter 48 does this by incrementing one count each time there is a no match condition generated at the output of comparator 18 or each time the new map generator 44 receives a shift input. Thus the no match indication indicates the number of non-repeat characters which will be transmitted and the shift increment indicates the number of characters in the new map. As indicated hereinbefore, there is also included a new map counter 50. New map counter 50 indicates the number of characters in the map and is incremented each time there is a shift input to register 44.

Having generated the new map, a decision must be made as to whether or not the new map or the old map is to be used. This is accomplished by means of the old map tester 22 as shown in FIG. 6. The logic shown in FIG. 6 includes some of the elements shown in FIG. 5 as well as some of the elements shown in FIG. 7. It should be understood that the operation of each of such logic 20, 22, and 26, is conducted in three different phases. As previously discussed, the first phase is the generation of a new map as provided by logic 20, previously described; the second phase is the operation as provided by the old map tester 22 as shall be presently described; and the third phase is the operation of logic 26 as shall hereinafter be described with respect to FIG. 7. During each of these phases, the buffers 14 and 16 are configured differently by well known logic which may provide gating to arrange such buffers and other elements to provide the appropriate circuit paths. During each such phase for example, the contents of new line buffer 14 are completely shifted from the output of buffer 14.

Thus, with respect to FIG. 6, the contents of last line buffer 16 and new line buffer 14 are shifted out to the two inputs of comparator 18. In addition, the output of new line buffer 14 is fed back to the input of the line buffer 14, as well as the input of last line buffer 16, so that at the end of the shifting process, both buffers 14 and 16 will contain the same information. In checking to determine whether or not the old map will be useful with the present line of data, there is a checking process to determine if there is a match of the repeat characters. If there is a match from the repeat characters, the old map will be used. This is carried out by the logic shown in FIG. 6. Thus when comparator 18 generates a no match signal, this partially enables AND gate 60. Whether or not AND gate 60 is fully enabled to set decision flip-flop 70 is determined by the logic associated with register 62, counter 54, detector 66 and flip-flop 68. It is now noted that once decision flip-flop 70 is set, this means that the new map must be used for the present line of data.

Old map shift register 62 includes the old map, that is, the map which was used with the last line of data which was transmitted over line 28. Now with reference to the logic associated with register 62, initially, the output of toggle flip-flop 68 is a binary one, i.e. in the true state, which for a no match condition will enable AND gate 60. However, initially when buffers 14 and 16 are first shifting out characters therefrom, the initial characters on the line are by way of example repeat characters and are shifted out first. Accordingly there should be a match in that location. Accordingly the no match signal from comparator 18 is false and AND gate 60 is not enabled. It is noted that the initial output of toggle flip-flop 68 could have been a binary zero set as to enable correct operation if the first characters are non-repeat characters. Further, this alternate operation could be made adaptive in nature by use of further non-repeat character detectors so as to initialize the system accordingly. As shall be seen, the toggle flip-flop 68 will toggle its output between the shifting of repeat and non-repeat characters etc., and the input to gate 60 from flip-flop 68 will be true only when comparator 18 is comparing the matching between the repeat characters.

Thus, initially the toggle flip-flop 68 is a binary one and the toggle flip-flop 68 will not toggle to the zero state until zero detector 66 detects the output of counter 64 being zero. Counter 64 is decremented by the clock and receives as its input successive characters from register 62. Thus initially, and referring to FIG. 3 which will by way of example be the old map for purposes of this discussion, the initial conditions are that register 62 has shifted the character three (3) into counter 64. While the character (3) is counted down to zero, characters are being shifted out of buffers 14 and 16 for comparison. The counter 64 counts from character (3) down to zero, detector 66 will detect zero and toggle flip-flop 68 and in addition will cause a shift pulse to be applied to register 62 thereby shifting the next character in the map, i.e. the character (4) to the counter 64. This toggling of flip-flop 68 causes the lower input of gate 60 to be a binary zero and accordingly regardless of the match or no match condition generated when the non-repeat characters are being compared, the decision flip-flop 70 cannot be set.

It is important at this point to again note the significance of the setting of flip-flop 70. If decision flip-flop 70 is set, then this indicates that the old map will not be useable. Thus, initially the output of decision flip-flop 70 is in a binary zero or false state. As indicated hereinbefore, the only time this flip-flop 70 can be set is when the repeat characters are being compared. If repeat characters when compared generate a no match signal, then this will fully enable gate 60 to set flip-flop 70. The output of flip-flop 70 is coupled to one input of OR gate 74 whose output is coupled to set decision flip-flop 72. Thus, if decision flip-flop 70 is set, it being noted that it does not matter how many times there is a no match signal generated during the comparison of repeat characters for the present line, it being important only that decision flip-flop 70 has been set once, this indication which is transferred to the decision flip-flop 72 by the setting thereof indicates from the one output of decision flip-flop 72 that a new map is to be used, as indicated by the new map signal 88 being in a true state. If the decision flip-flop 72 has not been set, then the zero output of decision flip-flop 72 is a binary one thus indicating the use of the old map by means of signal 91.

Decision flip-flop 72 may also be set by another input received at OR gate 74, from decision logic 76. The basis of the input from decision logic 76 for using the new or old map is as follows. It is quite possible that if the old map is used to transmit the new line of data, it might still require the transmission of some characters which would be repeated using the new map and therefore would not be as efficient as if the new map was used. On the other hand, if the new map is to be used, it must be transmitted, and might, therefore, require a longer transmission. Making a decision on which map to use (it again being noted that the new map must be used if flip-flop 70 is set) the total lengths of the two possible transmissions is not sufficient since some consideration must be given to the efficiency of transmission of future lines of data. It would appear to over complicate the process to actually examine the efficiency of transmitting future lines using the old map or the new map. Therefore as a compromise, a comparison is made between the number of characters in the transmission which would result from using the old map as compared to a predetermined fraction of the number of characters in the new map plus the number of data characters resulting from the use of the new map. The fraction, may be, for example, one-half. Thus, whichever of these two counts is smaller will determine which map will be used. This compromise will prevent the change of a map because of a few accidental matching characters while at the same time it will not prevent the use of a map which will provide a true savings in the future. Thus the formula used in arriving at a decision is as follows, it being again noted that the efficiency count indicates the number of characters to be transmitted and the map count indicates the number of characters in the map. For the present line of data, new map and the new efficiency count are those presently generated by logic 20 and the old efficiency count is that which resulted when the last line of characters was transmitted. Thus the new map count 50 is multiplied by the predetermined fraction 84 by means of multiplier 86 and is coupled to the B input of subtractor 80. The A input of subtractor 80 receives the new efficiency count of counter 48. The result of subtracting such quantities by means of subtractor 80 is coupled to the A input of comparator 78. The B input of comparator 78 is coupled to receive the old efficiency count 82. Comparison is made by comparator 78 to determine whether or not A is less than B. If this is the case, then decision flip-flop 72 is set and a new map signal 88 is generated, and accordingly the new map will be used.

It should be understood that more than one old map may be made available such that by the operation of logic 22, one of such old maps may be found to be useable, thereby avoiding the need to transmit the new map. Thus, several registers 62 may be connected in a multiplexed arrangement. Further, the old map may be useable even if the sequence of counts for repeat and non-repeat characters appear to be different. For example, assuming a portion of the new map generated included a sequence of counts of 5, 2 and 4 for non-repeat, and repeat and non-repeat characters respectively, an old map having one count of 11 non-repeat characters in the same portion may nevertheless be useable. In this example, it would simply mean that the two repeat characters would be transmitted.

Having determined whether or not the new or the old map is to be used, the operation of actually transmitting the data is provided by means of logic 26 as shown in FIG. 7. During this third phase of operaton of the compression logic, the characters are transmitted. If the old map is to be used, then a special use old map character is transmitted and only the non-repeating characters are then transmitted. If the new map is to be transmitted, then the new map count is transmitted followed by the new map itself, which in turn is followed by the non-repeat characters. Dependent upon which signal i.e. signal 88 indicating the use of the new map signal 91 indicating use of the old map is generated, then the operation of the logic of FIG. 7 takes place in response to timing pulses which are generated by means of well known clock logic.

Thus, first referring to the situation in which the old map signal is indicated, that at time T1, AND gate 114 is fully enabled thereby enabling the special old map character 89 to be transferred via OR gate 102 through the line buffer 100 over communication line 28. At time T2, immediately following T1, AND gate 122 is fully enabled. The output of gate 122 passes via OR gate 128 to set flip-flop 110 which enables the shifting of characters, in response to the clock pulse received at AND gate 132, out of new line buffer 14. The characters shifted from buffer 14 are passed through AND gate 112 only if they are non-repeat characters. This operation will presently be described. The input to AND gate 112 from toggle flip-flop 108, if in the true state, i.e. a binary one, fully enables AND gate 112 thereby enabling the passing of the non-repeat characters through OR gate 102 through line buffer 100 and finally on line 28. The arrangement of toggle flip-flop 108, zero detector 106, counter 104, AND gate 124 and OR gate 130 are coupled to enable only the non-repeat characters shifted from buffer 14 to be transmitted over line 28. Such elements, i.e., the toggle flip-flop 108 etc. operate in similar fashion as did the elements associated with toggle flip-flop 68 of FIG. 6. However, for this logic of FIG. 7, initially the output of toggle flip-flop 108 is in the false or binary zero state, thereby disabling AND gate 112, when the initial repeat characters are being shifted from buffer 14. Toggle flip-flop 108 will be toggled when a zero is detected by means of detector 106 in response to the output of counter 104 which is decremented by the clock. Counter 104, as was the case for counter 64, receives via AND gate 124 the contents of the old map shift register 62 which is enabled at time T3. The old map is saved in register 62 by means of the feedback arrangement to the input thereof. The AND gate 124 is enabled in response to the enabling of AND gate 122 whose output is propogated through OR gate 130 to the other input of AND gate 124. Thus AND gate 112 is enabled only when the non-repeat characters are being shifted from buffer 14 thereby enabling only the non-repeat characters and not the repeat characters for transmission over the communication line 28. Thus in response to the generation of the use old map signal 91, the special old map character 89, folowed by the non-repeat characters from buffer 14 are transferred over communication line 28.

In response to the generation of the use new map signal 88 received from the logic of FIG. 6, at time T1, AND gate 116 is enabled to pass a new map count 50 through OR gate 102 and buffer 100 over communication line 28. At time T2, the AND gate 118 is enabled to pass the contents of new map register 44 through gate 102 and buffer 100 over line 28. In addition and now having transmitted the new map count and the new map over line 28, the contents of new map register 44 must be shifted into old map shift register 62. This is accomplished by the enabling of AND gate 120 at the time T3. Thus the new map will be the old map for the next line. Further, at time T4, AND gate 126 is enabled and further, by means of OR gate 130, enables AND gate 124. The output of AND gate 126 is also passed via OR gate 128 to set flip-flop 110 so as to shift the characters out of buffer 14. The operation of transmitting the non-repeat characters is the same as when the use old map signal was generated. Thus the data is transmitted over line 28 in a manner dependent upon which map has been used. The data is received by the receiving terminal over line 28 and is decompressed by means of the logic shown in FIG. 8.

Now referring to FIG. 8, the decompression apparatus for the data received over line 28 shall be discussed. The decompression apparatus is shown to inlcude a new data buffer 200, a decompressed data buffer 202 and a map buffer or register 204. Also included is a character counter 206 and phase generation logic 208 which in addition to including various AND and OR gates also includes phase generator 210. New data buffer 200 is coupled to receive data from communication line 28 and decompressed data buffer 202 will normally include data of the last or previous line which was received by the decompression logic 30. Map buffer 204 normally includes the old map, i.e., the last used map. Character counter 206 is similar to counter 104 of FIG. 7 or counter 64 in FIG. 6. Phase generator 210 includes eight flip-flops (not shown) of the D type which are coupled to generate the eight phases, levels or states S1 through S8. Clock B coupled to each D type flip-flop, enables the input signal thereto to be reflected at the output thereof. These state signals as well as clock A and clock B are utilized to provide the operation of the decompression logic 30. Clock A may be generated in logic 30 and includes repetitive pulses normally provided to enable the operation of logic 30, whereas clock B, which follows clock A in time, is also repetitive in nature, but is basically utilized to change the level of the state signals from generator 210.

Also included in logic 30 is a comparator 212, which upon detection of a start character received on line 28 at the beginning of the transmission in accordance with standard transmission characteristics, compares, by means of comparator 212, such start character with the start character 214 so as to initiate or initialize the operation of the decompression logic 30 by setting state 1 (S1). It is noted that while data is not being decompressed by logic 30, the phase generator is in state S8.

As indicated hereinbefore, if the old map is to be used, a use old map character is received by the decompression logic 30. This use old map character is indicated by the term "special character" in FIG. 8. Accordingly, operation when the old map is to be used will presently be discussed. The old map is included in map buffer 204. Additionally, when comparator 212 generates an equal output and since the logic 208 indicates state S8, gate 220 will be enabled to generate the state S1. This will enable the shifting of data into the input of buffer 200 in response to the S1 signal received at one input of OR gate 222 and in response to the clock A signal. By means of flip-flop 224, the signal S1 will remain true until the start character is detected at the output of buffer 200. This is provided by detector 226 which is similar in operation to the detector comprising elements 212 and 214. Thus with the new data buffer 200, and the detector 226 indicating that the start character has been received at the output of buffer 200, the next character in buffer 200 will be shifted into character counter 206 by the enabling of AND gate 228 which passes such character through OR gate 230 to counter 206 at time clock A. This character which is loaded into character counter 206 will be the special character if we are to be using the old map which is the case by way of illustration here. This special character will be detected by detector 232 and will enable signal S4 by the enabling of AND gate 234 and setting of the flip-flop associated with state S4 via OR gate 236. In order to eliminate any race conditions by the early termination of state S1, the input of AND gate 234 from signal S1 may be delayed by a delay element not shown. It is noted that levels of signals S2 and S3 are not utilized when the old map is being used, but that they will be utilized when the operation requires the new map.

Having generated state S4, at such time, i.e., the time when state S4 is true, the first character in map buffer 204, which is shifted in response to the signals received by gate 296, will be transferred into the character counter 206 and back into the map buffer 204. This is accomplished by means of gates 240, 242, 230 and gate 244. A check is first made to see whether or not this is the last character in the map buffer, i.e. whether or not the contents of the map buffer have been completely shifted out. This may be indicated by another special character which may by way of illustration be the same special character which indicates the use of the old map. This is detected by detector 232. If such special character is not detected as is the case for the first shift from map buffer 204, then via NAND gate 246, AND gate 248, and OR gate 250, state S5 is set. In response to state S5, the character is shifted from the output of decompressed data buffer 202 back into its input by means of gates 252 and 254, and the character counter 206 is decremented in response to the S5 signal at the input of OR gate 260. At this point it is determined whether or not the character counter 206 has been decremented to all zeros so as to indicate the transition from the repeat portion of the data to the non-repeat portion thereof or vice versa. This is similar in operaton as was in FIG. 6 for the toggle flip-flop 68, zero detector 66, and counter 64 in combination with register 62.

When zero detector 262 detects a zero at the output of the character counter 206, then the next signal level, i.e. state S6 will be set. However, assuming that the zero is not so detected, NAND gate 264 will provide a true signal to one input of AND gate 266 and the other input which receives the S5 level will enable gate 266 so as to allow the state S5 via OR gate 250 to again be set at the time of clock B. This causes the counter 206 to be decremented again, the buffer 202 to shift the next character out and back into its input and so on until the zero is actually detected at the output of counter 206. Thus, the repeat characters are being saved in the data buffer 202. As shall be seen, when the non-repeat characters are being shifted out of data buffer 202, they will not be saved.

When the zero is detected, AND gate 268 will be enabled allowing the setting of state S6. At this time, the next character in the map buffer 204 will be shifted back into the map buffer's input by the enabling of AND gate 242. In addition, such characters shifted out of map buffer 204 are loaded into the character counter 206. The output of character counter 206 is again checked to determine whether or not this is the last character in the map as indicated by the special character. It is noted that the special character which has been placed in such map buffer 204 in the last position thereof shall be hereinafter discussed with respect to the operation when a new map is used. If the special character has not been detected, AND gate 270 will be enabled so as to set state S7 via OR gate 272. At this time, i.e., the time when state S7 is present, the characters in the data buffer 200 will be shifted into buffer 202 via the enabling of gate 274. Buffer 202 is enabled for shifting by the S7 signal received at the input of OR gate 276. Thus in this manner, the characters are shifted from the output of buffer 202 and are not saved since these characters are the non-repeat characters. The non-repeat characters, however, for this line, are transferred into buffer 202 from buffer 200.

Also at time S7, counter 206 is decremented so that this process during time S7 is repeated until a zero is detected at the output of character counter 206. The state S7 is regenerated by the enabling via NAND gate 264 of AND gate 278. However, when the zero is detected, then AND gate 280 is enabled to again set state S4. When state S4 is set, the operation as described above with respect to the time when state S4 is generated, is again repeated, i.e., the contents, a character at a time, are shifted out of map buffer 204 into the counter 206 and also back into the map buffer 204. If at the time S4, the special character i.e., indicating the end of the map buffer is detected, then AND gate 282 is enabled setting state S8 via OR gate 284 thereby causing the operaton to go into the idle or pause state waiting for a new transmission. The process again continues from state S4 and recycles until the operation goes to the pause state as indicated by the state S8. State S8 may also be generated during the time that state S6 is provided. For example, if the special character is detected during the generation of state S6, AND gate 286 will be set and via OR gate 284 will set the state S8. The state S8 will be maintained if there is no other received data, thereby enabling AND gate 288. Thus at the end of the entire process, what is contained in the various buffers is as follows: new data buffer 200 is now empty, decompressed data buffer 202 now includes the characters which were repeated from the last line and also the new non-repeat characters. Map buffer 204 will contain the old map. The contents of buffer 202 may now be used or stored by the receiving terminal.

The operation of the decompression logic 30 when the new map is to be received is almost identical with that operation when the old map is received. However, instead of jumping from state S1 into state S4, state S2 is entered from state S1. At time S2, the contents of new data buffer 200, a character at a time, is shifted into the map buffer 204. This is accomplished by the enabling of AND gate 290. In addition, character counter 206 is decremented. It is noted that the character counter 206 during state S1 when we are to be using the new map will include the new map count which is first received over line 28. Thus if there are ten map characters, the initial output is ten and will be decremented until a zero is detected by detector 262. Initially, the zero will not be detected, however after sufficient shift and sufficient decrements, the zero is detected. This accomplishes the shifting of the new map, which follows the new map count, into the map buffer 204. When a zero is detected, state S3 is enabled via AND gate 292, a special character 294 is placed in buffer 204 to indicate the end, i.e., the last character in the map buffer 204. The change in state from S1 to S2 is accomplished by means of the non-detection of the special character thereby enabling gate 298 to set state S2 via OR gate 302, whereas the state S2 is regenerated in response to a lack of zero detection which enables gate 300. The enabling of state S3 is accomplished when AND gate 304 is enabled in response to the lack of the zero detection from detector 262.

Thus with the map buffer 204 full with the new map, the remaining non-repeat characters are operated on in a manner similar to that description of the operation when the old map was used. Finally, state S8 is entered and the decompression logic 30 waits to receive a new transmission.

It should be understood that various changes may be made to the instant invention without departing from the spirit and scope of the invention. For example, the various gating structures may be modified such as by use of different type gates or as previously discussed, either the non-repeat or repeat characters may be the initial characters in a group or line of characters. Further, the instant invention may be extended to include a system which uses a multiplicity of old maps and/or old data lines along with a method of determining which of these old maps and data lines are to be used to compress and decompress the current line. Further, the instant invention may be programmed on a general purpose computer without departing from the spirit and scope of the invention.

Having described the invention, what is claimed as new and novel and for which it is desired to acquire Letters Patent is:

1. Data communications apparatus comprising:
  A. first buffer means for providing a first plurality of data representative of the present data to be compressed;
  B. second buffer means for providing a second plurality of data representative of data previously compressed;
  C. means for comparing the individual data in said first buffer means with the individual data in said second buffer means;
  D. means, responsive to the comparison made by said means for comparing, for generating a new map indicating, in the order of comparison, the number of repeat data and the number of non-repeat data detected between said first and second pluralities of data; and
  E. means, responsive to said means for generating, for transmitting only those individual data of said first plurality of data which are detected to be non-repeat data as indicated by said new map.

2. Apparatus as in claim 1 further comprising:
  A. an old map which indicates the number of repeat data and the number of non-repeat data detected between two successive, previously compared pluralities of data;
  B. means for determining whether said old map is useable for transmitting those individual data of said first plurality of data which are detected to be non-repeat data;
  C. means, included in said means for transmitting, for using said old map for such transmission instead of said new map, if said old map is determined to be useable for transmitting those individual data of said first plurality of data which are detected to be non-repeat data; and
  D. means, included in said means for transmitting for additionally transmitting said new map if said old map is determined to not be so useable.

3. Apparatus as in claim 2 further comprising means for decompressing said data received in compressed form from said means for transmitting, said means for decompressing comprising:
- A. means for storing the last plurality of data received from said means for transmitting; and
- B. means for storing the last map received from said means for transmitting; and
- C. means for regenerating said data in decompressed form, in accordance with the pattern of repeat and non-repeat data indicated by said new map if said new map was received from said means for transmitting, or in accordance with the pattern indicated by said last map, by selecting said repeat data from said means for storing the last plurality of data and by selecting said non-repeat data received from said means for transmitting.

4. Apparatus as in claim 1 wherein both said first buffer means and said second buffer means are shift registers and wherein each of said pluralities of data comprise a plurality of data characters, said means for comparing coupled to compare characters in said first and second buffer means as said characters are shifted therefrom to determine whether said characters are repeat or non-repeat characters, said means for generating said new map comprising:
- A. a new map register, said new map register comprising a plurality of character locations coupled for shifting characters therebetween, the first location of said new map register coupled for enabling a counting function;
- B. means for counting in said first location of said new map register each time a comparison is made by said means for comparing;
- C. means for shifting the count from said first location to the next location in said new map register each time a boundary between a group of repeat characters and a group of non-repeat characters is detected; and
- D. means for restarting the count of said counting function in said first location each time said count is shifted from said first location, whereby said new map is generated in said new map register with alternating counts representative of the number of repeat or non-repeat characters by groups.

5. Apparatus as in claim 4 further comprising:
- A. means, coupled with said means for comparing and said new map register, for indicating the number of characters to be transmitted if said new map is also to be transmitted; and
- B. means, coupled with said new map register, for indicating the number of counts in said new map, the number of counts in said new map representative of the number of groups of repeat and non-repeat characters.

6. Apparatus as in claim 4 wherein said means for determining, whether said old map reflects substantially the same numbers of repeat and non-repeat data as does said new map, comprises:
- A. means for comparing the characters shifted from said first and second buffer means to determine whether they do not match;
- B. an old map which indicates the numbers of repeat and non-repeat characters detected between two successive, previously compared pluralities of data;
- C. means, responsive to said old map and coupled with said means for comparing the characters shifted from said buffer means, for generating a first signal if there is a no match condition when said characters are shifted from both said buffer means and if said old map indicates that repeat characters are being so shifted, said first signal indicating that said old map cannot be used and that said new map must be used by said means for transmitting for transmitting said non-repeat characters.

7. Apparatus as in claim 6 further including decision logic comprising:
- A. means for determining a first quantity of characters which would be transmitted if by use of the old map only the non-repeat characters are transmitted;
- B. means for determining a second quantity of characters which would be transmitted if by use of the new map, both the new map and the non-repeat characters are transmitted;
- C. means for determining the smaller of said first quantity and a third quantity which is the sum of a predetermined fraction of the characters in said new map plus the number of non-repeat characters; and
- D. means, coupled with said means for transmitting, for enabling the transfer of said characters associated with the smaller quantity.

8. Data communications apparatus comprising:
- A. a first shift register having a plurality of positions, each for storing one data representation of a first group of data representations;
- B. a second shift register having a plurality of positions, each for storing one data representation of a second group of data representations;
- C. means for shifting data representations of said first and second groups from said first and second registers respectively;
- D. means for comparing a data representation of said first group with a data representation of said second group each time said data representations are shifted by said means for shifting, said means for comparing generating a match signal if said data representations compare and a no-match signal if said data representations do not compare;
- E. map register means having a first position coupled for receiving first signals and for counting the number of said first signals received, and having a plurality of further positions, said plurality of further positions and said first position coupled in a shift register arrangement in order to enable the counted number of first signals in said first position to be shifted into said further positions;
- F. means, responsive to either said match or no match signals, for generating said first signal and enabling the counting in said first positions;
- G. means, coupled with said means for comparing and responsive to a change from the generation of said match signal to the generation of said no match signal or vice-versa, for shifting the count in said first position to the next one of said further positions and for shifting the counts in said further positions; and
- H. means, coupled with said map register means and said second shift register, for transmitting data representations from said second shift register which are not the same as data representations in like positions of said first shift register.

9. Apparatus as in claim 8 wherein said means for transmitting comprises:
- A. means for generating a second signal for each of the counts included in the positions of said map register means which counts represent data representations which are repetitive, and a third signal for each one of such counts which represent data representations which are non-repetitive;

B. means, responsive to said second signal, for disabling the transmission of said data representations which are repetitive; and C. means, responsive to said third signal, for enabling the transmission of said data representations which are non-repetitive.

10. Apparatus as in claim 8 wherein said data representations in said first register represent a further group of data characters which have been previously transmitted and wherein said data representations in said second register represent a second group of data characters which are to be presently transmitted.

11. Apparatus as in claim 10 wherein said means for transmitting further comprises:

A. an old map register for storing the counts generated by said map register means in association with the transmission of said first group of data characters;

B. means for transferring said second group of data characters using said counts stored in said old map register if said counts in said new map register means substantially compare with the counts in said old map register; and C. means for transferring the contents of said new map register means, if said counts in said new map register means do not substantially compare with the counts in said old map register.

12. Apparatus as in claim 11 further comprising means for receiving said data characters and said counts in said new map register means from said means for transmitting, said means for receiving comprising:

A. first means for storing the counts of said new map register means last received by said means for receiving;

B. second means for storing the last group of data characters transmitted to said means for receiving;

C. means, coupled with said second means for storing, for decompressing the presently received groups of said data characters in accordance with the pattern of counts in said first means for storing, if the counts generated in association with said presently received group of data characters is not received;

D. third means for storing the counts of said new map register means presently received with said presently received group of data characters; and E. means, coupled with said second means for storing, for decompressing the presently received group of data characters in accordance with the pattern of counts in said third means for storing.

13. A machine implemented process comprising the steps of:

A. providing by means of a first buffer means a first plurality of data representative of the present data to be compressed;

B. providing by means of a second buffer means a second plurality of data representative of data previously compressed;

C. comparing the individual data in said first buffer means with the individual data in said second buffer means;

D. generating, in response to the comparison made during said step of comparing, a new map indicating, in the order of comparison, the number of repeat data and the number of non-repeat data detected between said first and second pluralities of data; and E. transmitting, in response to said step of generating, only those individual data of said first plurality of data which are detected to be non-repeat data as indicated by said new map.

14. A process as in claim 13 further comprising the steps of:

A. providing an old map which indicates the number of repeat data and the number of non-repeat data detected between two successive, previously compared pluralities of data;

B. determining whether said old map reflects substantially the same numbers of repeat and non-repeat data as does said new map; and C. additionally transmitting said new map if said old map does not reflect substantially the same numbers of repeat and non-repeat data as does said new map.

15. A process as in claim 14 further comprising the steps of decompressing said data received in compressed form, said step of decompressing comprising the steps of:

A. storing the last plurality of data received;

B. storing the last map received; and

C. regenerating said data in decompressed form, in accordance with the pattern of repeat and non-repeat data indicated by said new map if said new map was received, or in accordance with the pattern indicated by said last map, by selecting the stored ones of said repeat data of the last plurality of data and by selecting said non-repeat data received.

16. A process as in claim 13 wherein both said first buffer means and said second buffer means are shift registers and wherein each of said pluralities of data comprise a plurality of data characters, said steps of comparing coupled to compare characters in said first and second buffer means as said characters are shifted therefrom to determine whether said characters are repeat or non-repeat characters, said steps of generating said new map comprising the steps of:

A. providing a new map register, said new map register comprising a plurality of character locations coupled for shifting characters therebetween, the first location of said new map register coupled for enabling a counting function;

B. counting in said first location of said new map register each time a comparison is made during said step of comparing;

C. shifting the count from said first location to the next location in said new map register each time a boundary between a group of repeat characters and a group of non-repeat characters is detected; and D. restarting the count of said counting function in said first location each time said count is shifted from said first location, whereby said new map is generated in said new map register with alternating counts representative of the number of repeat or non-repeat characters by groups.

17. A process as in claim 16 wherein said step of determining, whether said old map reflects substantially the same numbers of repeat and non-repeat data as does said new map, comprises the steps of:

A. comparing the characters shifted from said first and second buffer means to determine whether they do not match;
B. providing an old map which indicates the numbers of repeat and non-repeat characters detected between two successive, previously compared pluralities of data;
C. generating, in response to said old map and to the characters shifted from said buffer means, a first signal if there is a no match condition when said characters are shifted from both said buffer means and if said old map indicates that repeat characters are being so shifted, said first signal indicating that said old map cannot be used and that said new map must be used during said step of transmitting for transmitting said non-repeat characters.

* * * * *